United States Patent [19]

Wilczak

[11] Patent Number: 4,945,027

[45] Date of Patent: Jul. 31, 1990

[54] 1,4 OR 9,10 DIMETHOXYANTHRACENE TRIGGERS FOR 2-TRI(CHLORO OR BROMO)METHYL-4(1H)-QUINAZOLIMONE POLYMERIZATION INITIATORS

[75] Inventor: Wojciech A. Wilczak, Scotch Plains, N.J.

[73] Assignee: Hoechst Celanese Corporation, Somerville, N.J.

[21] Appl. No.: 112,797

[22] Filed: Oct. 23, 1987

[51] Int. Cl.$^5$ .................................. G03C 1/68
[52] U.S. Cl. .................... 430/281; 430/920; 430/915; 522/26; 522/28; 522/50
[58] Field of Search ............... 430/281, 920; 522/26, 522/28

[56] References Cited

U.S. PATENT DOCUMENTS

| | | | |
|---|---|---|---|
| 3,729,313 | 4/1973 | Smith | 430/281 |
| 3,954,475 | 5/1976 | Bonham et al. | 430/920 |
| 4,239,850 | 12/1980 | Kita et al. | 430/281 |
| 4,258,123 | 3/1981 | Nagashima et al. | 430/281 |
| 4,481,276 | 11/1984 | Ishikawa et al. | 430/281 |
| 4,504,573 | 3/1985 | Ishikawa et al. | 430/288 |
| 4,505,793 | 3/1985 | Tamoto et al. | 430/920 |
| 4,584,260 | 4/1986 | Iwasaki et al. | 430/288 |

FOREIGN PATENT DOCUMENTS

| | | |
|---|---|---|
| 1142788 | 3/1983 | Canada . |
| 0053747 | 9/1980 | Japan . |
| 60-06010 | 4/1985 | Japan . |

OTHER PUBLICATIONS

Chemical Abstracts, vol. 101, 238170j.

*Primary Examiner*—Paul R. Michl
*Assistant Examiner*—Susan E. Shaw McBee
*Attorney, Agent, or Firm*—Richard S. Roberts

[57] ABSTRACT

A photopolymerization initiator composition is disclosed. The composition is comprised of 1,4 or 9,10 dimethoxyanthracene and 2-tri(chloro or bromo)methyl-4(1H)-quinazolinone. The initiator composition is useful in preparing photopolymerizable compositions having increased effective photospeed.

19 Claims, No Drawings

1,4 OR 9,10 DIMETHOXYANTHRACENE TRIGGERS FOR 2-TRI(CHLORO OR BROMO)METHYL-4(1H)-QUINAZOLIMONE POLYMERIZATION INITIATORS

BACKGROUND OF THE INVENTION

The present invention relates polymerization initiator compositions for polymerizing ethylenically unsaturated compounds and to photopolymerization initiator compositions having high sensitivity which are sensitive to a small amount of exposure from ultraviolet rays and visible rays and which can be used in connection with color proofing films.

Certain organic compounds are known to dissociate in the presence of light and generate free radicals. Some of the more common photolyzable organic compounds generate free halogen, which is a good hydrogen abstractor and will form hydrogen halide in the presence of hydrogen donors. The generation of free radicals in photosensitive systems containing photolyzable compounds has found many practical uses, particularly in the graphic arts field. Such systems have been described for free radical photography (e.g. print-out and bleach systems), free radical photopolymerization and photoinduced acid catalyzed reactions of many types, many of which have found valuable application in printing, duplicating, copying and other imaging systems.

It is well known that monomers, dimers, trimers, oligomers and prepolymers which have unsaturated bonds in the molecule can be polymerized in a presence of a photo polymerization initiator. Further, this phenomenon has been widely utilized in photo polymerization of photoresists printing plates, and color proofing films.

Useful known photo polymerization initiators include various substances which have been found to be practical. For example, benzoin, benzoin methyl ether, or benzoin ethyl ether, etc., carbonyl compounds such as benzil, benzophenone, acetophenone, Michler's ketone, azo compounds such as azobisisobutyronitrile or azodibenzoyl, etc., sulfur compounds such as dibenzothiazolyl sulfide or tetraethylthiuram disulfide, etc., halogen compounds such as carbon tetrabromide or tribromophenyl sulfone, etc., and 1,2-benzanthraquinone, etc.

However, these initiators are not sufficiently satisfactory. When they are used for polymerization of various ethylenically unsaturated compounds, they do not always have good sensitivity as photopolymers.

Sensitizers have been employed to broaden the spectral response of photosensitive compounds, especially in the visible portion of the light spectrum.

Furthermore, it is desired to have high sensitivity photoinitiators which can be employed in compositions which can be exposed by laser light or by projection through a mask. Typical initiators have a low quantum efficiency and therefore require the use of a high powered u.v. light source while an exposure mask is held in close contact with an exposure mask in a vacuum frame. In projection exposure, light, preferably visible light, is projected through a mask and a lens onto a light sensitive target film. To allow exposure, initiation sensitivity must be quite high and must be of an effective wavelength.

As described above, the prior photo-polymers are not satisfactory with respect to both sensitivity and their sensitive wavelength range, and they are, particularly, unsuitable as light-sensitive materials for visible light laser.

Still further, in the field of color proofing films, the color condition of the image formed is critical. Color proofing films typically comprise a transparent substrate and a colored photosensitive composition on the substrate. Color matching to an original image is crucial and therefore it is important that the non-colorant ingredients of the photosensitive composition contribute as little color modification as possible. The initiator composition of this invention permits the use of a lower amount of the initiator ingredient in the colored photosensitive composition and hence a lower amount of color contamination.

SUMMARY OF THE INVENTION

The invention provides a photopolymerization initiator composition which comprises 1,4 or 9,10 dimethoxyanthracene and 2-tri(chloro or bromo)methyl-4(1H)quinazolinone in a respective weight ratio of from about 0.05:1 to about 1:1.

The invention also provides a photopolymerizable composition which comprises a photopolymerizable compound containing at least two ethylinically unsaturated double bonds and the above photopolymerization initiator composition.

The invention also provides a photographic element which comprises a substrate and a photopolymerizable composition coated on said substrate, which photopolymerizable compound containing at least two ethylinically unsaturated double bonds and the above photopolymerization initiator composition.

DETAILED DESCRIPTION OF THE PREFERRED EMBODIMENT

2-Trichloromethyl-4(1H)-quinazolinone is a free radical photopolymerization initiator per se known in the art and has the formula:

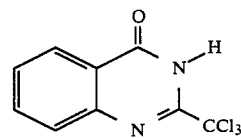

Such are more fully described in German Offen. DE No. 3 339 228 and Belgian patent No.876,734. Upon exposure to actinic radiation it releases chlorine free radicals, which are capable of initiating polymerization of suitable ethylenically unsaturated compounds. However, it only absorbs UV light of wavelength shorter than 320 nm. It has now been found that when even catalytic amounts of 1,4 or 9,10-dimethoxyanthracene are incorporated with the quinazolinone, the thusly formed composition is capable of causing photopolymerization at 400 nm, a wavelength at which the quinazolinone alone is completely unreactive. The anthracene compounds have the formulae:

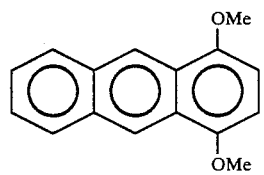

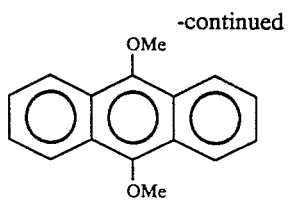

This anthracene compound itself is an electron donor but is not a polymerization initiator. The anthracene compound acts as a trigger for the quinazolinone and allows photopolymerization at visible light and near u.v., i.e. 360–420 nm wavelengths.

Such visible light wavelength sources are suitable for laser and projection speed imaging, and are very well suited for use in color proofing films since less initiator is necessary for exposure. This therefore translates into reduced color contamination.

While the ratio of anthracene component to quinazolinone compound may range from 0.05:1 to 1:1 it is more preferably from about 0.1 to 1 and most preferably from about 1 to 1.

The photopolymerizable composition of this invention generally comprises a photopolymerizable material having at least two double bonds and the foregoing photoinitiator composition. The photopolymerizable composition additionally has a binder resin in the preferred embodiment.

The photopolymerizable material comprises an addition polymerizable, nongaseous (boiling temperature above 100° C. at normal atmospheric pressure), ethylenically-unsaturated compounds containing at least two terminal ethylenic groups, and being capable of forming a high molecular weight polymer by free-radical initiated, chain propagating addition polymerization. Suitable polymerizable materials non-exclusively include such acrylic or methacrylic acid esters as polybutane diol diacrylate, tetraethylene glycol dimethacrylate, ethylene glycol dimethacrylate, trimethylol propane timethyacrylate, trimethylol propane triacrylate, polyethylene glycol (200) diacrylate, diethylene glycol dimethacrylate, pentaerythritol tetraacrylate, dicyclopentenyl acrylate, dicyclopentenyl methacrylate, 1,4 butane diol diacrylate, 1,6,hexanediol dimethacrylate, dipentaerythritol monohydroxypentaacrylate, ethoxylate bisphenol A dimethacrylate and tripropylyene glycol diacrylate.

Binders found suitable for this use are styrene/maleic anhydride polymers that can vary in monomer content at a ratio of from about 70/30 to about 95/5; polymethyl methacrylate/methacrylic acid copolymers having a ratio of monomers ranging from about 70/30 to 95/5; polymethyl methacrylate/ethyl acrylate/methacrylic acid copolymer having a ratio of monomers ranging from about 50/30/20 to about 90/5/5; polymethyl methacrylate/butyl acrylate/ methacrylic acid copolymer having a ratio of monomers ranging from about 50/30/20 to about 90/5/5. Binders with no acid value but with the solubility characteristics to develop properly in the alkaline aqueous developers useful for the invention. Examples of this type of binder system non-exclusively include polyvinyl pyrrolidone polymers K-60 and K-90 (G.A.F.) cellulosic resins such as hydroxypropyl cellulose, methyl cellulose and ethyl hydroxy ethyl cellulose polymers. Additional binders non-exclusively include polyvinyl acetals such as polyvinyl formal and polyvinyl butyral available as Formvar and Butvar from Monsanto, and polyvinyl alcohols.

One preferred binding resin has the general formula

—A—B—C— wherein a plurality of each of components A, B and C occur in ordered or random sequence in the resin and wherein A is present in said resin at about to about 20% by weight and comprises groups of the formula

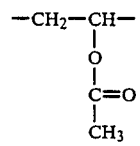

B is present in said resin at about 4% to about 30% by weight and comprises groups of the formula

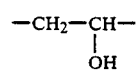

and C is present in said resin at about 50% to about 91% by weight and comprises acetal groups consisting of groups of the formulae

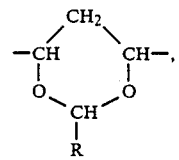 (I)

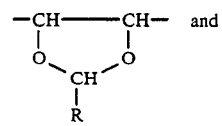 and (II)

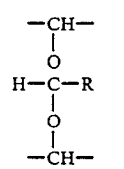 (III)

where R is lower alkyl or hydrogen, and wherein said group I is present in component C from about 75% to about 85%, group 11 is present in component C from about 3% to about 5%; and group III is present in component C from about 10% to about 22%; wherein said groups I, Il and III are based on the number of acetal groups in component C. This composition is more fully described in U.S. Pat. No. 4,670,507 which is incorporated herein by reference.

Pigments or dyes may typically be included in the photopolymerizable composition to provide color to the image areas.

Preferred colorants for this invention are pigments and dyes. They are dispersed in a small amount of a suitable vehicle such as polymethyl methacrylate/methacrylic acid (85/15) and methyl ethyl ketone solvent.

Additional non-exclusive examples of colorants usable in the present invention are as follows: Benzidine Yellow G (C.I. 21090), Benzidine Yellow Gr (C.I.

21100), Permanent Yellow DHG (product of Hoechst AG), Brilliant Carmine 6B (C.I. 15850), Rhodamine 6G Lake (C.I. 45160), Rhodamine B Lake (C.I. 45170), Phthalocyanine Blue non-crystal (C.I. 74160), phthalocyanine Green (C.I. 74260), Carbon Black, Fat Yellow 5G, Fat Yellow 3G, Fat Red G, Fat Red HRR, Fat Red 5B, Fat Black HB, Zapon Fast Black RE, Zapon Fast Black G, Zapon Fast Blue HFL, Zapon Fast Red BB, Zapon Fast Red GE, Zapon Fast Yellow G, quinacridone Red (C.I. 46500).

In the practice of the present invention the binder component is preferably present in the composition in an amount sufficient to bind the composition components in a uniform mixture and a uniform film when it is coated on a substrate. It is preferably present in an amount ranging from about 18.0% to about 40.0% based on the weight of the solids in the layer. A more preferred range is from about 20.0% to about 38.0% and most preferably from about 22.0% to about 33.0%.

In the practice of the present invention the photoinitiator composition is preferably present in the photopolymerizable composition in an amount sufficient to initiate the free radical polymerization of the unsaturated component upon exposure to imaging energy. It is preferably present in an amount ranging from about 5% to about 25% based on the weight of the solids in the layer. A more preferred range is from about 8% to about 22% and most preferably from about 10% to about 20%.

In the practice of the present invention the colorant component is preferably present in an amount sufficient to uniformly color the photopolymerizable composition. It is preferably present in an amount ranging from about 1% to about 20% based on the weight of the solids in the layer. A more preferred range is from about 3% to about 18% and most preferably from about 5% to about 15%.

In the practice of the present invention the unsaturated component is preferably present in the composition in an amount sufficient to cause an imagewise latent differential in the polymerizable composition when it is coated on a substrate and imagewise exposed to imaging energy. It is preferably present in an amount ranging from about 20% to about 60% based on the weight of the solids in the layer. A more preferred range is from about 22% to about 58% and most preferably from about 25% to about 55%.

Other components which may be included in the radiation-polymerizable composition of this invention include acid stabilizers, exposure indicators, plasticizers and photoactivators.

Suitable acid stabilizers useful within the context of this invention include phosphoric, citric, benzoic, m-nitro benzoic, p(p-anilino phenylazo) benzene sulfonic acid, 4,4'-dinitro-2,2'-stilbene disulfonic, itaconic, tartaric and p-toluene sulfonic acid and mixtures thereof. Preferably, the acid stabilizer is phosphoric acid. When used, the acid stabilizer is preferably present in the radiation-polymerizable composition in the amount of from about 0.3% to about 2.0%, and most preferably from about 7.5% to about 1.5%, although the skilled artisan may use more or less as desired.

Exposure indicators (or photoimagers) which may be useful in conjunction with the present invention include 4-phenylazodiphenylamine, eosin, azobenzene, Calcozine Fuchine dyes and Crystal Violet and Methylene Blue dyes. Preferably, the exposure indicator is 4-phenylazodiphenylamine. The exposure indicator, when one is used, is preferably present in the composition in an amount of from about 0.001% to about 0.0035% by weight. A more preferred range is from about 0.002% to about 0.030% and, most preferably, the exposure indicator is present in an amount of from about 0.005% to about 0.20%, although the skilled artisan may use more or less as desired.

The photoactivator which may be included in the composition of this invention should be an amine-containing photoactivator which combines synergistically with the free-radical photoinitiator in order to extend the effective half-life of the photoinitiator, which is normally in the approximate range of about $10^{-9}$ to $10^{-15}$ seconds. Suitable photoactivators include 2-(N-butoxy) ethyl-4-dimethylamino benzoate, 2-(dimethylamino) amino benzoate and acrylated amines. Preferably the photoactivator is ethyl-4-dimethylamino benzoate. The photoactivator is preferably present in the composition of this invention in an amount of from about 1.0% to about 4.0% by weight, although the skilled artisan may use more or less as desired.

A plasticizer may also be included in the composition of this invention to prevent coating brittleness and to keep the composition pliable if desired. Suitable plasticizers include dibutylphthalate, triarylphosphate and substituted analogs thereof and, preferably dioctylphthalate. The plasticizer is preferably present in the composition of this invention in an amount of from about 0.5% to about 1.25% be weight, although the skilled artisan may use more or less as desired.

In order to form a coating composition for the production of photographic elements, the composition of this invention may be dissolved in admixture in a solvent or mixture of solvents to facilitate application of the composition to the substrate. Suitable solvents for this purpose include water, tetrahydrofuran, butyrolactone, glycol ethers such as propylene glycol monomethyl ether and methyl Cellosolve, alcohols such as ethanol and n-propanol, and ketones such as methyl ethyl ketone, or mixtures thereof. Preferably, the solvent comprises a mixture of tetrahydrofuran, propylene glycol, monomethyl ether and butyrolactone. In general, the solvent system is evaporated from the coating composition once it is applied to an appropriate substrate, however, some insignificant amount of solvent may remain as residue.

Substrates useful for coating with the composition of this invention to form a photographic element such as a color proofing film, silk screen stencil photoresist or lithographic printing plate include sheets of transparent films such as polyester, aluminum and its alloys and other metals, fabrics, silicon and similar materials useful for semiconductors such as gallium arsenide which are well known in the art. Preferably, the substrate comprises aluminum. The substrate may first be pretreated by standard graining and/or etching and/or anodizing techniques as are well known in the art, and also may or may not have been treated with a composition such as polyvinyl phosphonic acid, sodium silicate or the like suitable for use as a hydrophilizing agent.

In the production of photographic elements such as lithographic printing plates, an aluminum substrate is first preferably grained by art recognized methods such as by means of a wire brush, a slurry of particulates or by chemical or electrochemical means, for example in an electolyte solution comprising hydrochloric acid. The grained plate is preferably then anodized for example in sulfuric or phosphoric acid in a manner well known in the art. The grained and optionally anodized surface is preferably then rendered hydrophilic by treatment with polyvinyl phosphonic acid by means which are also known to the skilled artisan. The thusly prepared plate is then coated with the base composition of the present invention, preferably at a coating weight of from about 0.6 g/m² to about 30.0 g/m², more preferably from about 0.8 g/m² to about 2.0 g/m² and most preferably from about 1.2 g/m° to about 1.5g/m², although these coating weights are not critical to the practice of this invention, and dried.

The light sensitive layer is then exposed to actinic radiation such as ultraviolet or x-ray or exposed to a particle beam such as electron or ion beam. In the preferred embodiment, the photosensitive layer is imagewise exposed by means well known in the art. Such exposure may be conducted by exposure to a UV light source through a photomask under vacuum frame conditions. Exposure may be performed with actinic light through a conventional negative flat. Exposures are preferred with emulsion-to-emulsion contact. Mercury vapor discharge lamps are preferred to metal halide lamps. Filters may be used to reduce light scattering in the material.

Preferably the thusly prepared photographic element is exposed to actinic radiation through a negative test flat so as to yield a solid 6 on a 21 step Stouffer exposure wedge after development. The exposed plate is then developed with a suitable aqueous developer composition such as a developer which comprises an aqueous solution containing one or more of the following groups:

(a) a sodium, potassium or lithium salt of octyl, decyl or dodecyl monosulfate;
(b) a sodium, lithium, potassium or ammonium metasilicate salt; and
(c) a lithium, potassium, sodium or ammonium borate salt; and
(d) an aliphatic dicarboxylic acid, or sodium, potassium or ammonium salt thereof having from 2 to 6 carbon atoms; and
(e) mono, di-, or tri-sodium or -potassium phosphate.

Other suitable developers include water, benzoic acid or sodium, lithium and potassium benzoates and the hydroxy substituted analogs thereof as well as those developers described in U.S. Pat. No. 4,436,807. The developer may also contain organic solvents which are well known in the art, although these are less preferred.

The following examples are illustrative of the invention but it is understood that the invention is not limited thereto.

EXAMPLE 1

The following photosensitive mixture is prepared, wire-rod #12 —coated on Melinex 516, air-dried, overcoated with polyvinyl alcohol protective antioxygen layer, air-dried, exposed for 15 BAU in Ascor-Berkey unit through Schott GG - 400 nm cutoff filter and hand-developed with Enco NAPS/PAPS developer (commercially available from Hoechst Celanese Corporation, Somerville, N.J.).

Methyl cellosolve—51.42 g
Methyl ethyl ketone—21.82 g
Butyrolactone—11.82 g
Scripset 540—1.57 g (Monsanto)
Terpolymer resin from U.S. Pat. No. 4,670,507—0.25 g
2-Trichloromethyl-4(1H)-quinazolinone—1.00 g
9,10-Dimethoxyanthracene—0.1 g
Pentaerythritoltriacrylate—3.5 g
L- Cyan dispersion—12 g Hand development gives a good image with a clear 5 on the Stouffer scale. When 9,10-dimethoxyanthracene is not present in the formulation, no image is obtained.

EXAMPLE 2

Example 1 is repeated except 1,4 dimethoxyanthracene is substituted for 9,10 dimethoxyanthracene. Similar results are noticed.

What is claimed is:

1. A polymerization initiator composition which comprises in admixture 1,4 or 9,10 dimethoxyanthracene and 2-tri(chloro or bromo)methyl-4(1H)-quinazolinone in a respective weight ratio of from about 0.05:1 to about 1:1.

2. The initiator composition of claim 1 wherein the ratio of anthracene compound to quinazolinone compound ranges from about 1:1 to about 1:1.

3. A photopolymerizable composition which comprises a photopolymerizable compound containing at least two ethylenically unsaturated double bonds and a photopolymerization initiator composition which initiator composition comprises in admixture 1,4 or 9,10 dimethoxyanthracene and 2-tri(chloro- or bromo)methyl-4(1H)-quinazolinone in a respective ratio of from about 0.05:1 to about 1:1, wherein said initiator composition is present in sufficient amount to initiate the polymerization of said photopolymerizable compound upon exposure to sufficient activating energy.

4. The photopolymerizable composition of claim 3 wherein the photopolymerizable compound is an acrylic or methacrylic acid ester.

5. The photopolymerizable composition of claim 3 further comprising a binder in sufficient amount to bind the composition components in a uniform mixture.

6. The photopolymerizable composition of claim 3 comprising a binder selected from the group consisting of polyvinyl acetals, polyvinyl pyrrolidone, cellulosic resins, styrene maleic anhydride copolymers, styrene/maleic anhydride polymers having a monomer ratio of from about 70/30 to about 95/5; polymethyl methacrylate/methacrylic acid copolymers having a monomer ratio of from about 70/30 to about 95/5; polymethyl methacrylate/ethyl acrylate/methacrylic acid copolymer having a monomer ratio of from about 50/30/20 to 90/5/5, and polymethyl methacrylate/butyl acrylate/methacrylic acid copolymer having a monomer ratio of from about 50/30/20 to about 90/5/5

7. The photopolymerizable composition of claim 5 wherein the binding resin has the general formula

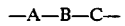

wherein a plurality of each of components A, B and C occur in ordered or random sequence in the resin and wherein A is present in said resin at about 5% to about 20% by weight and comprises groups of the formula

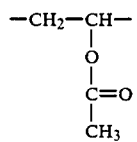

B is present in said resin at about 4% to about 30% by weight and comprises groups of the formula

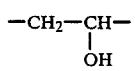

and C is present in said resin at about 50% to about 91% by weight and comprises acetal groups consisting of groups of the formulae

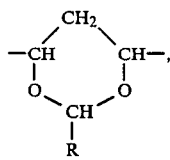 (I)

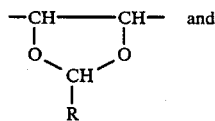 and (II)

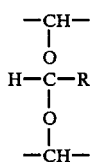 (III)

where R is lower alkyl or hydrogen, and wherein said group I is present in component C from about 75% to about 85%, group II is present in component C from about 3% to about 5%, and group III is present in component C from about 10% to about 22%, wherein said groups I, II and III are based on the number of acetal groups in component C.

8. The photopolymerizable composition of claim 3 wherein the ratio of anthracene compound to quinazolinone compound ranges from about 1:1. to about 1:1.

9. The photopolymerizable composition of claim 3 further comprising one or more components selected from the group consisting of colorants, acid stabilizers, exposure indicators, plasticizers, solvents and photoactivators.

10. A photographic element which comprises a substrate and a photopolymerizable composition coated on said substrate, which photopolymerizable composition containing at least two ethylenically unsaturated double bonds, and a photopolymerization initiator composition which comprises in admixture 1,4 or 9,10 dimethoxyanthracene and 2-tri(chloro or bromo)methyl-4(1H)-quinazolinone in a respective ratio of from about 0.05:1 to about 1:1, wherein said initiator composition is present in sufficient amount to initiate the polymerization of said photopolymerizable compound upon exposure to sufficient activating energy.

11. The photographic element of claim 10 wherein said substrate comprises a material selected from the group consisting of transparent films, metals, fabrics and semiconductor materials.

12. The photographic element of claim 10 wherein said substrate comprises a material selected from the group consisting of polyester, silicon, gallium arsenide, aluminum and its alloys.

13. The photographic element of claim 10 wherein said substrate comprises aluminum or an aluminum alloy sheet, the surface of which has been subjected to one or more treatments selected from the group consisting of graining, anodizing and hydrophilizing.

14. The photographic element of claim 10 wherein the photopolymerizable compound is an acrylic or methacrylic acid ester.

15. The photographic element of claim 10 wherein the photopolymerizable composition further comprising a binder in sufficient amount to bind the composition components in a uniform mixture.

16. The photographic element of claim 15 comprising a binder selected from the group consisting of polyvinyl acetals, polyvinyl pyrrolidone, cellulosic resins, styrene maleic anhydride copolymers, styrene/maleic anhydride polymers having a monomer ratio of from about 70/30 to about 95/5; polymethyl methacrylate/methacrylic acid copolymers having a monomer ratio of from about 70/30 to about 95/5; polymethyl methacrylate/ethyl acrylate/methacrylic acid copolymer having a monomer ratio of from about 50/30/20 to about 90/5/5; and polymethyl methacrylate/butyl acrylate/methacrylic acid copolymer having a monomer ratio of from about 50/30/20 to about 90/5/5.

17. The photographic element of claim 15 wherein the binding resin has the general formula

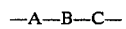

wherein a plurality of each of components A, B and C occur in ordered or random sequence in the resin and wherein A is present in said resin at about 5% to about 20% by weight and comprises groups of the formula

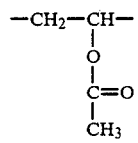

B is present in said resin at about 4% to about 30% by weight and comprises groups of the formula

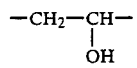

and C is present in said resin at about 50% to about 91% by weight and comprises acetal groups consisting of groups of the formulae

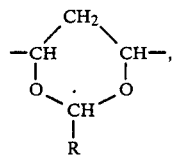 (I)

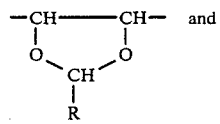 and (II)

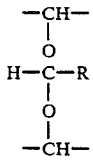

(III)

where R is lower alkyl or hydrogen, and wherein said group I is present in component C from about 75% to about 85%, group II is present in component C from about 3% to about 5%; and group III is present in component C from about 10% to about 22%, wherein said groups I, II and III are based on the number of acetal groups in component C.

18. The photographic element of claim 15 wherein the photopolymerizable composition further comprises one or more components, selected from the group consisting of colorants, acid stabilizers, exposure indicators, plasticizers, solvents and photoactivators.

19. The photographic element of claim 15 wherein the ratio of anthracene compound to quinazolinone compound ranges from about 1:1 to about 1:1.

* * * * *